United States Patent
Park et al.

(10) Patent No.: US 9,948,321 B2
(45) Date of Patent: Apr. 17, 2018

(54) SEMICONDUCTOR APPARATUS

(71) Applicant: SK hynix Inc., Icheon-si, Gyeonggi-do (KR)

(72) Inventors: Myeong Jae Park, Icheon-si (KR); Jeong Kyoum Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/157,600

(22) Filed: May 18, 2016

(65) Prior Publication Data

US 2017/0187517 A1 Jun. 29, 2017

(30) Foreign Application Priority Data

Dec. 28, 2015 (KR) .................. 10-2015-0187656

(51) Int. Cl.
*H03M 9/00* (2006.01)
*G06F 1/04* (2006.01)
*H04L 7/00* (2006.01)
*H03K 19/21* (2006.01)

(52) U.S. Cl.
CPC ............. *H03M 9/00* (2013.01); *G06F 1/04* (2013.01); *H04L 7/0079* (2013.01); *H04L 7/0091* (2013.01); *H03K 19/21* (2013.01)

(58) Field of Classification Search
CPC ......... H03M 9/00; H04B 17/00; H04B 17/10; H04B 17/15; H04B 17/20; H04B 17/29; H04L 1/24; H04L 7/00; H04L 7/0054; H04L 7/0079; H04L 7/0091; G01R 31/317; G01R 31/3181; G01R 31/31813
See application file for complete search history.

(56) References Cited

U.S. PATENT DOCUMENTS

| | | | |
|---|---|---|---|
| 7,363,563 B1 * | 4/2008 | Hissen | H04L 1/243 327/144 |
| 8,478,554 B1 | 7/2013 | Sheng | |
| 8,514,955 B2 * | 8/2013 | Moriizumi | H04L 1/0061 375/260 |
| 2008/0143396 A1 * | 6/2008 | Nishida | G01R 31/31709 327/146 |
| 2011/0199138 A1 * | 8/2011 | Sano | H03L 7/0807 327/158 |

FOREIGN PATENT DOCUMENTS

KR 100795724 B1 1/2008

* cited by examiner

*Primary Examiner* — Betsy Deppe
(74) *Attorney, Agent, or Firm* — William Park & Associates Ltd.

(57) ABSTRACT

A semiconductor apparatus includes a pattern conversion circuit configured to generate conversion data in response to a monitoring enable signal, pattern select signals and parallel input data; a transmission circuit configured to output the conversion data as serial data in response to a plurality of clocks; a reception circuit configured to output the serial data as parallel output data in synchronization with the plurality of clocks; and a monitoring circuit configured to generate a result signal in response to the plurality of clocks, clock select signals and the serial data.

20 Claims, 4 Drawing Sheets

SEMICONDUCTOR APPARATUS

CROSS-REFERENCES TO RELATED APPLICATION

The present application claims priority under 35 U.S.C. § 119(a) to Korean application number 10-2015-0187656, filed on Dec. 28, 2015, in the Korean Intellectual Property Office, which is incorporated herein by reference in its entirety.

BACKGROUND

1. Technical Field

Various embodiments generally relate to a semiconductor integrated circuit, and, more particularly, to a semiconductor apparatus configured to output a result signal indicating whether data is being normally transmitted.

2. Related Art

A semiconductor integrated circuit is configured to transmit and receive signals to and from an external circuit or is configured such that internal circuits transmit and receive signals to and from one another.

In order to increase an operation speed of a semiconductor integrated circuit, when transmitting and receiving signals the semiconductor integrated circuit is configured to synchronously transmit a signal with a clock or receive a signal by using the clock.

Signals to be transmitted and received and a clock should be synchronized at precise timings. When the signals to be transmitted and received and the clock are not synchronized at precise timings, the semiconductor integrated circuit may misoperate by receiving an erroneous signal.

Thus, it is necessary to monitor whether the signals to be transmitted and received and the clock are synchronized at precise timings.

SUMMARY

In an embodiment, a semiconductor apparatus may include: a pattern conversion circuit configured to generate conversion data in response to a monitoring enable signal, pattern select signals and parallel input data; a transmission circuit configured to output the conversion data as serial data in response to a plurality of clocks; a reception circuit configured to output the serial data as parallel output data in response to the plurality of clocks; and a monitoring circuit configured to generate a result signal in synchronization with the plurality of clocks, clock select signals and the serial data.

In an embodiment, a semiconductor apparatus may include: a pattern conversion circuit configured to output a plurality of parallel input data as a plurality of conversion data in response to pattern select signals when a monitoring enable signal is enabled, and set one among the plurality of conversion data to a specified level; a transmission circuit configured to output the plurality of respective conversion data as serial data in synchronization with a plurality of clocks, respectively; a reception circuit configured to output the serial data as a plurality of parallel output data in synchronization with the plurality of clocks, respectively; and a monitoring circuit configured to sample the serial data by using one clock among the plurality of clocks in response to clock select signals, compare a sampled data value with a predetermined data value, and generate a result signal.

DETAILED DESCRIPTION

Hereinafter, a semiconductor apparatus will be described below with reference to the accompanying drawings through various examples of embodiments.

Figure 1:
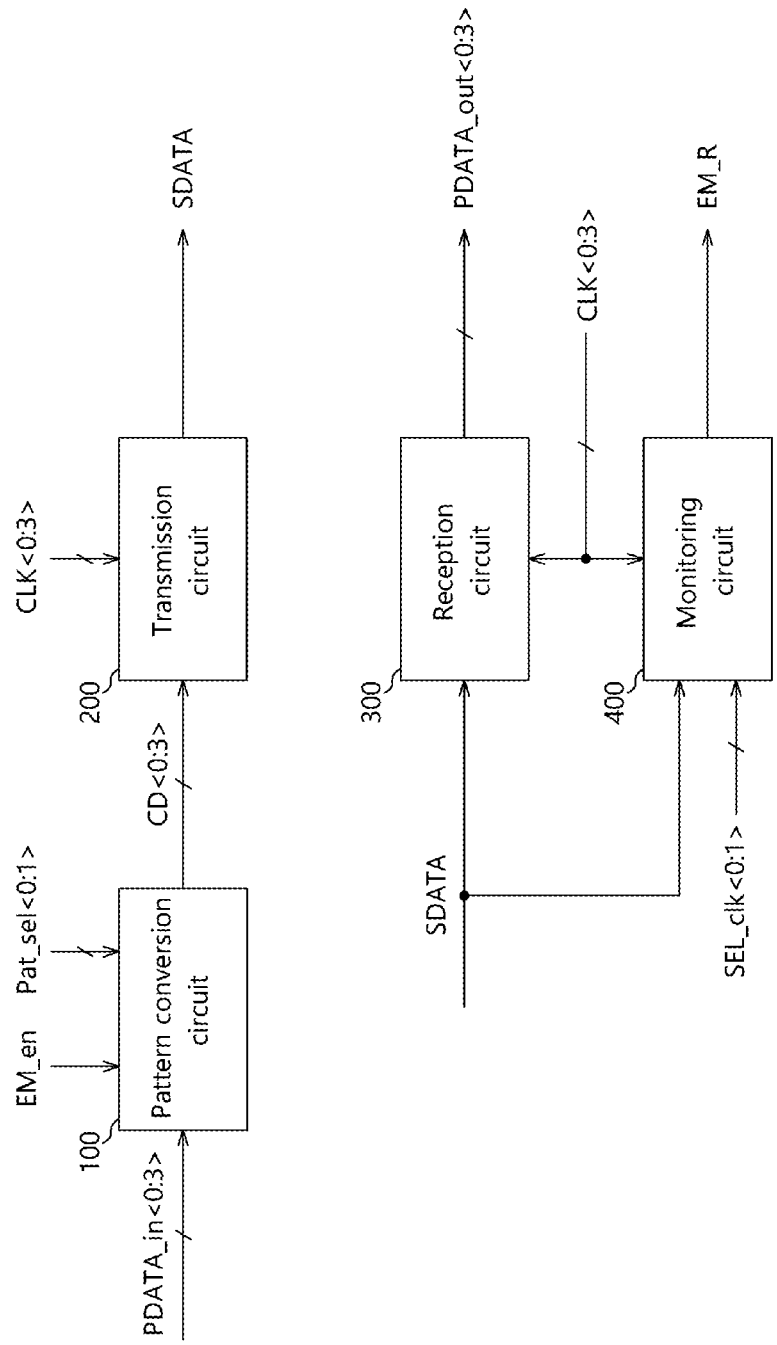
FIG. 1 is a configuration diagram illustrating a representation of an example of a semiconductor apparatus in accordance with an embodiment.

As shown in FIG. 1, a semiconductor apparatus in accordance with an embodiment may include a pattern conversion circuit 100, a transmission circuit 200, a reception circuit 300, and a monitoring circuit 400.

The pattern conversion circuit 100 converts a pattern of parallel input data PDATA_in<0:3> in response to a monitoring enable signal EM_en and pattern select signals Pat_sel<0:1>, and generates conversion data CD<0:3>. For example, the pattern conversion circuit 100 outputs the parallel input data PDATA_in<0:3> as the conversion data CD<0:3>. The pattern conversion circuit 100 outputs the conversion data CD<0:3> by setting data of a predetermined bit pattern from the conversion data CD<0:3> to a specified level in response to the pattern select signals Pat_sel<0:1> when the monitoring enable signal EM_en is enabled. The pattern conversion circuit 100 outputs the parallel input data PDATA_in<0:3> as the conversion data CD<0:3> when the monitoring enable signal EM_en is disabled regardless of the state of the pattern select signals Pat_sel<0:1>.

The transmission circuit 200 may output the conversion data CD<0:3> as serial data SDATA in synchronization with first to fourth clocks CLK<0:3>. For example, the transmission circuit 200 outputs first conversion data CD<0> among the conversion data CD<0:3> as the serial data SDATA in synchronization with the first clock CLK<0>. The transmission circuit 200 outputs second conversion data CD<1> among the conversion data CD<0:3> as the serial data SDATA in synchronization with the second clock CLK<1>. The transmission circuit 200 outputs third conversion data CD<2> among the conversion data CD<0:3> as the serial data SDATA in synchronization with the third clock CLK<2>. The transmission circuit 200 outputs fourth conversion data CD<3> among the conversion data CD<0:3> as the serial data SDATA in synchronization with the fourth clock CLK<3>. Among the first to fourth clocks CLK<0:3>, the phase of the first clock CLK<0> is earliest, the phase of the second clock CLK<1> is later than the first clock CLK<0>, the phase of the third clock CLK<2> is later than the phase of the second clock CLK<1>, and the phase of the fourth clock CLK<3> is later than the phase of the third clock CLK<2>.

The reception circuit 300 outputs the serial data SDATA as parallel output data PDATA_out<0:3> in synchronization with the first to fourth clocks CLK<0:3>. For example, the reception circuit 300 outputs the serial data SDATA as first parallel output data PDATA_out<0> among the parallel output data PDATA_out<0:3> in synchronization with the first clock CLK<0>. The reception circuit 300 outputs the serial data SDATA as second parallel output data PDATA_out<1> among the parallel output data PDATA_out<0:3> in synchronization with the second clock CLK<1>. The reception circuit 300 outputs the serial data SDATA as third parallel output data PDATA_out<2> among the parallel output data PDATA_out<0:3> in synchronization with the third clock CLK<2>. The reception circuit 300 outputs the serial data SDATA as fourth parallel output data PDATA_out<3> among the parallel output data PDATA_out<0:3> in synchronization with the fourth clock CLK<3>.

The monitoring circuit 400 monitors the serial data SDATA according to one clock selected among the first to fourth clocks CLK<0:3> in response to first and second clock select signals SEL_clk<0:1>, and the monitoring circuit 400 outputs a monitoring result as a result signal EM_R. For example, the monitoring circuit 400 selects one among the first to fourth clocks CLK<0:3> in response to the first and second clock select signals SEL_clk<0:1>, and samples the serial data SDATA in response to the selected clock. The monitoring circuit 400 determines whether a data value obtained by sampling the serial data SDATA is equal to a predetermined value, and outputs a determination result as the result signal EM_R.

Figure 2:
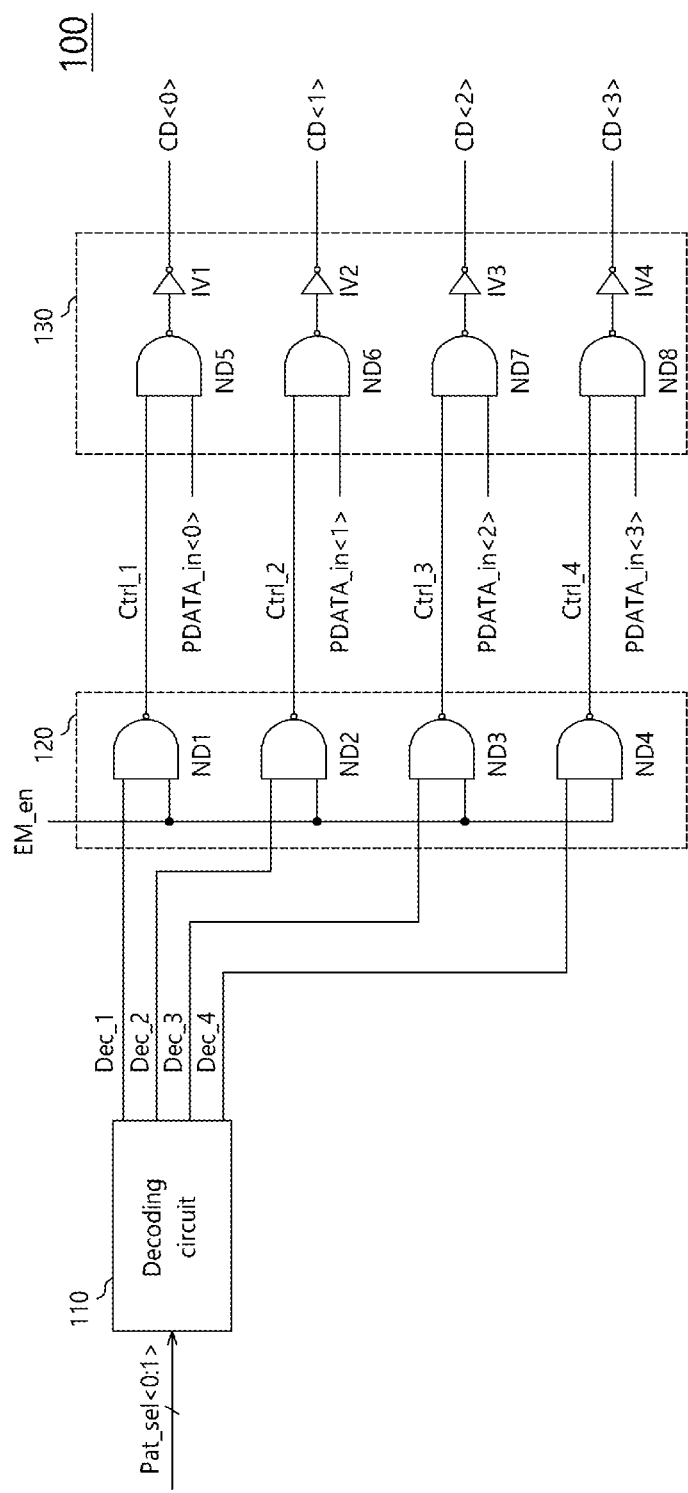
FIG. 2 is a configuration diagram illustrating a representation of an example of a pattern conversion circuit shown in FIG. 1.

As shown in FIG. 2, the pattern conversion circuit 200 may include a decoding circuit 110, a control circuit 120, and an output circuit 130.

The decoding circuit 110 may enable one of first to fourth decoding signals Dec_1, Dec_2, Dec_3 and Dec_4 in response to the pattern select signals Pat_sel<0:1>. For example, the decoding circuit 110 enables one among the first to fourth decoding signals Dec_1, Dec_2, Dec_3 and Dec_4 by decoding the pattern select signals Pat_sel<0:1>.

The control circuit 120 generates first to fourth control signals Ctrl_1, Ctrl_2, Ctrl_3 and Ctrl_4 in response to the monitoring enable signal EM_en and the first to fourth decoding signals Dec_1, Dec_2, Dec_3 and Dec_4. For example, the control circuit 120 enables one among the first to fourth control signals Ctrl_1, Ctrl_2, Ctrl_3 and Ctrl_4 in response to the first to fourth decoding signals Dec_1, Dec_2, Dec_3 and Dec_4 when the monitoring enable signal EM_en is enabled. The control circuit 120 disables all of the first to fourth control signals Ctrl_1, Ctrl_2, Ctrl_3 and Ctrl_4 regardless of the state of the first to fourth decoding signals Dec_1, Dec_2, Dec_3 and Dec_4 when the monitoring enable signal EM_en is disabled. In detail, the control circuit 120 inverts the first to fourth decoding signals Dec_1, Dec_2, Dec_3 and Dec_4 when the monitoring enable signal EM_en is enabled, and outputs the first to fourth control signals Ctrl_1, Ctrl_2, Ctrl_3 and Ctrl_4. When the first to fourth decoding signals Dec_1, Dec_2, Dec_3 and Dec_4 are signals which are enabled to a high level, the first to fourth control signals Ctrl_1, Ctrl_2, Ctrl_3 and Ctrl_4 are signals which are enabled to a low level.

The control circuit 120 may include first to fourth NAND gates ND1, ND2, ND3 and ND4. The first NAND gate ND1 is inputted with the first decoding signal Dec_1 and the monitoring enable signal EM_en, and outputs the first control signal Ctrl_1. The second NAND gate ND2 is inputted with the second decoding signal Dec_2 and the monitoring enable signal EM_en, and outputs the second control signal Ctrl_2. The third NAND gate ND3 is inputted with the third decoding signal Dec_3 and the monitoring enable signal EM_en, and outputs the third control signal Ctrl_3. The fourth NAND gate ND4 is inputted with the fourth decoding signal Dec_4 and the monitoring enable signal EM_en, and outputs the fourth control signal Ctrl_4.

The output circuit 130 outputs the parallel input data PDATA_in<0:3> as the conversion data CD<0:3> in response to the first to fourth control signals Ctrl_1, Ctrl_2, Ctrl_3 and Ctrl_4. The output circuit 130 sets one among the conversion data CD<0:3> to a specified level when one signal among the first to fourth control signals Ctrl_1, Ctrl_2, Ctrl_3 and Ctrl_4 is enabled. For example, the output circuit 130 sets the first conversion data CD<0> among the conversion data CD<0:3> to a low level when the first control signal Ctrl_1 is enabled, and outputs remaining parallel input data PDATA_in<1:3> excluding first parallel input data PDATA_in<0>, as remaining conversion data CD<1:3> excluding the first conversion data CD<0>. The output circuit 130 sets the second conversion data CD<1> among the conversion data CD<0:3> to the low level when the second control signal Ctrl_2 is enabled, and outputs remaining parallel input data PDATA_in<0> and PDATA_in<2:3> excluding second parallel input data PDATA_in<1>, as remaining conversion data CD<0> and CD<2:3> excluding the second conversion data CD<1>. The output circuit 130 sets the third conversion data CD<2> among the conversion data CD<0:3> to the low level when the third control signal Ctrl_3 is enabled, and outputs remaining parallel input data PDATA_in<0:1> and PDATA_in<3> excluding third parallel input data PDATA_in<2>, as remaining conversion data CD<0:1> and CD<3> excluding the third conversion data CD<2>. The output circuit 130 sets the fourth conversion data CD<3> among the conversion data CD<0:3> to the low level when the fourth control signal Ctrl_4 is enabled, and outputs remaining parallel input data PDATA_in<0:2> excluding fourth parallel input data PDATA_in<3>, as remaining conversion data CD<0:2> excluding the fourth conversion data CD<3>.

The output circuit 130 may include fifth to eighth NAND gates ND5, ND6, ND7 and ND8 and first to fourth inverters IV1, IV2, IV3 and IV4. The fifth NAND gate ND5 is inputted with the first control signal Ctrl_1 and the first parallel input data PDATA_in<0> among the parallel input data PDATA_in<0:3>. The first inverter IV1 is inputted with the output signal of the fifth NAND gate ND5, and outputs the first conversion data CD<0> among the conversion data CD<0:3>. The sixth NAND gate ND6 is inputted with the second control signal Ctrl_2 and the second parallel input data PDATA_in<1> among the parallel input data PDATA_in<0:3>. The second inverter IV2 is inputted with the output signal of the sixth NAND gate ND6, and outputs the second conversion data CD<1> among the conversion data CD<0:3>. The seventh NAND gate ND7 is inputted with the third control signal Ctrl_3 and the third parallel input data PDATA_in<2> among the parallel input data PDATA_in<0:3>. The third inverter IV3 is inputted with the output signal of the seventh NAND gate ND7, and outputs the third conversion data CD<2> among the conversion data CD<0:3>. The eighth NAND gate ND8 is inputted with the fourth control signal Ctrl_4 and the fourth parallel input data PDATA_in<3> among the parallel input data PDATA_in<0:3>. The fourth inverter IV4 is inputted with the output signal of the eighth NAND gate ND8, and outputs the fourth conversion data CD<3> among the conversion data CD<0:3>.

Figure 3:
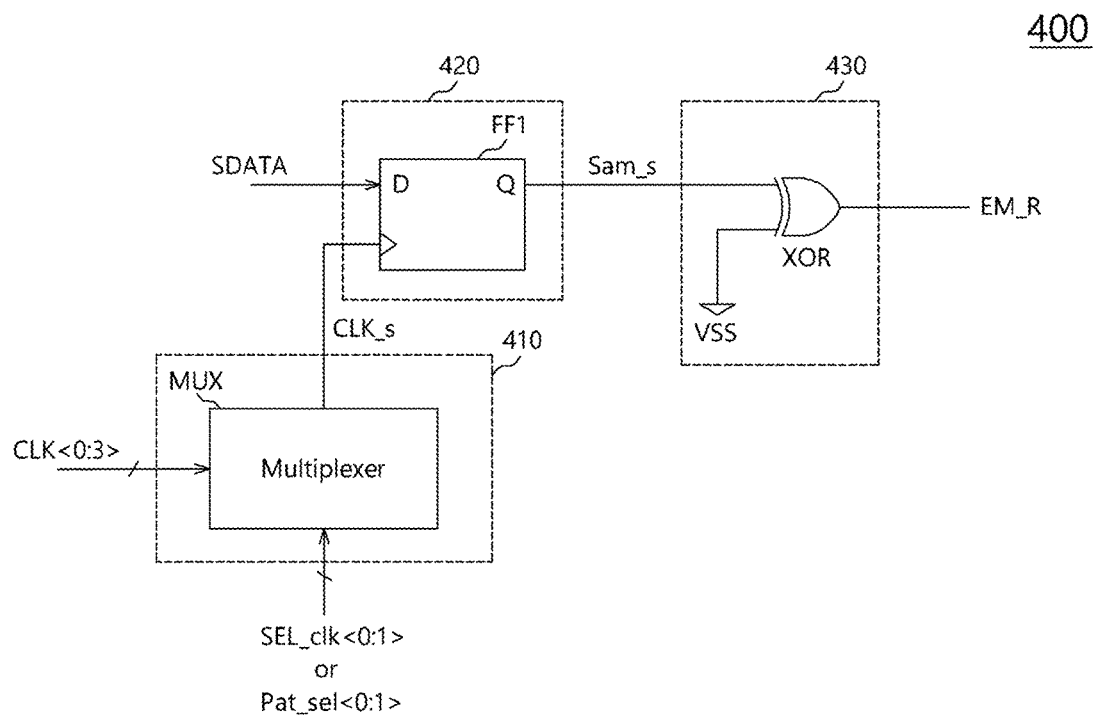
FIG. 3 is a configuration diagram illustrating a representation of an example of a monitoring circuit shown in FIG. 1.

As shown in FIG. 3, the monitoring circuit 400 may include a clock selection circuit 410, a sampling circuit 420, and a comparison circuit 430.

The clock selection circuit 410 outputs one among the first to fourth clocks CLK<0:3> as a selected clock CLK_s in response to the clock select signals SEL_clk<0:1>. The clock selection circuit 410 may include a multiplexer MUX. The clock select signals SEL_clk<0:1> may be the same signals as the pattern select signals Pat_sel<0:1>.

The sampling circuit 420 samples the serial data SDATA by using the selected clock CLK_s, and outputs a sampled signal as a sample signal Sam_s. For example, the sampling circuit 420 latches the serial data SDATA at a rising timing of the selected clock CLK_s, and outputs a latched result as the sample signal Sam_s.

The sampling circuit 420 may include a flip-flop FF1. The flip-flop FF1 is inputted with the serial data SDATA and the selected clock CLK_s, and the flip-flop FF1 outputs the sample signal Sam_s.

The comparison circuit 430 determines whether the sample signal Sam_s is the same as a predetermined value, and generates the result signal EM_R. For example, the comparison circuit 430 determines whether the sample signal Sam_s is a low level, and disables the result signal EM_R when the sample signal Sam_s is the low level. The comparison circuit 430 determines whether the sample signal Sam_s is the low level, and enables the result signal EM_R when the sample signal Sam_s is not the low level.

The comparison circuit 430 may include an XOR gate XOR. The XOR gate is inputted with the sample signal Sam_s through a first input terminal is applied with a ground voltage VSS through a second input terminal, and outputs the result signal EM_R through an output terminal.

The semiconductor apparatus in accordance with an embodiment, configured as mentioned above, operates as follows.

When a data monitoring operation is not performed, that is, in a normal operation, the monitoring enable signal EM_en is disabled.

The pattern conversion circuit 100 outputs the parallel input data PDATA_in<0:3> as the conversion data CD<0:3> when the monitoring enable signal EM_en is disabled.

With reference to FIG. 2, operation of the pattern conversion circuit 100 will be described below in detail.

The control circuit 120 disables all the first to fourth control signals Ctrl_1, Ctrl_2, Ctrl_3 and Ctrl_4 to a high level regardless of the state of the first to fourth decoding signals Dec_1, Dec_2, Dec_3 and Dec_4 generated in response to the pattern select signals Pat_sel<0:1>, when the monitoring enable signal EM_en is disabled.

The output circuit 130 outputs the parallel input data PDATA_in<0:3> as the conversion data CD<0:3> in response to the parallel input data PDATA_in<0:3> when all the first to fourth control signals Ctrl_1, Ctrl_2, Ctrl_3 and Ctrl_4 are disabled.

The transmission circuit 200 outputs the conversion data CD<0:3> as the serial data SDATA in synchronization with the first to fourth clocks CLK<0:3>. For example, the transmission circuit 200 outputs the first conversion data CD<0> among the conversion data CD<0:3> as the serial data SDATA in synchronization with the first clock CLK<0>. The transmission circuit 200 outputs the second conversion data CD<1> among the conversion data CD<0:3> as the serial data SDATA in synchronization with the second clock CLK<1>. The transmission circuit 200 outputs the third conversion data CD<2> among the conversion data CD<0:3> as the serial data SDATA in synchronization with the third clock CLK<2>. The transmission circuit 200 outputs the fourth conversion data CD<3> among the conversion data CD<0:3> as the serial data SDATA in synchronization with the fourth clock CLK<3>.

The reception circuit 300 outputs the serial data SDATA as the parallel output data PDATA_out<0:3> in synchronization with the first to fourth clocks CLK<0:3>. For example, the reception circuit 300 outputs data synchronized with the first clock CLK<0> in the serial data SDATA, as the first parallel output data PDATA_out<0> among the parallel output data PDATA_out<0:3>. The reception circuit 300 outputs data synchronized with the second clock CLK<1> in the serial data SDATA, as the second parallel output data PDATA_out<1> among the parallel output data PDATA_out<0:3>. The reception circuit 300 outputs data synchronized with the third clock CLK<2> in the serial data SDATA, as the third parallel output data PDATA_out<2> among the parallel output data PDATA_out<0:3>. The reception circuit 300 outputs data synchronized with the fourth clock CLK<3> in the serial data SDATA, as the fourth parallel output data PDATA_out<3> among the parallel output data PDATA_out<0:3>.

Therefore, in the semiconductor apparatus in accordance with an embodiment, when the data monitoring operation is not performed, the pattern conversion circuit 100, the transmission circuit 200, and the reception circuit 300 operate in such a way as to output the parallel input data PDATA_in<0:3> as the serial data SDATA and output the serial data SDATA as the parallel output data PDATA_out<0:3>.

When the data monitoring operation is performed, the monitoring enable signal EM_en is enabled.

The pattern conversion circuit 100 converts the parallel input data PDATA_in<0:3> in response to the pattern select signals Pat_sel<0:1> when the monitoring enable signal EM_en is enabled, and the pattern conversion circuit 100 outputs converted data as the conversion data CD<0:3>.

With reference to FIG. 2, operation of the pattern conversion circuit 100 will be described below as an example.

The decoding circuit 110 decodes the pattern select signals Pat_sel<0:1>, and enables one among the first to fourth decoding signals Dec_1, Dec_2, Dec_3 and Dec_4 to the high level and disables remaining decoding signals of the first to fourth decoding signals Dec_1, Dec_2, Dec_3 and Dec_4 to a low level.

In the state in which the monitoring enable signal EM_en is enabled, the control circuit 120 is inputted with the first to fourth decoding signals Dec_1, Dec_2, Dec_3 and Dec_4 which include only one enabled decoding signal. If the control circuit 120 is inputted with the first to fourth decoding signals Dec_1, Dec_2, Dec_3 and Dec_4 in which only the first decoding signal Dec_1 is enabled to the high level, the control circuit 120 enables only the first control signal Ctrl_1 to the low level among the first to fourth control signals Ctrl_1, Ctrl_2, Ctrl_3 and Ctrl_4, and disables the remaining control signals Ctrl_2, Ctrl_3 and Ctrl_4 to the high level. If the control circuit 120 is inputted with the first to fourth decoding signals Dec_1, Dec_2, Dec_3 and Dec_4 in which only the second decoding signal Dec_2 is enabled to the high level, the control circuit 120 enables only the second control signal Ctrl_2 to the low level among the first to fourth control signals Ctrl_1, Ctrl_2, Ctrl_3 and Ctrl_4, and disables the remaining control signals Ctrl_1, Ctrl_3 and Ctrl_4 to the high level. If the control circuit 120 is inputted with the first to fourth decoding signals Dec_1, Dec_2, Dec_3 and Dec_4 in which only the third decoding signal Dec_3 is enabled to the high level, the control circuit 120 enables only the third control signal Ctrl_3 to the low level among the first to fourth control signals Ctrl_1, Ctrl_2, Ctrl_3 and Ctrl_4, and disables the remaining control signals Ctrl_1, Ctrl_2 and Ctrl_4 to the high level. If the control circuit 120 is inputted with the first to fourth decoding signals Dec_1, Dec_2, Dec_3 and Dec_4 in which only the fourth decoding signal Dec_4 is enabled to the high level, the control circuit 120 enables only the fourth control signal Ctrl_4 to the low level among the first to fourth control signals Ctrl_1, Ctrl_2, Ctrl_3 and Ctrl_4, and disables the remaining control signals Ctrl_1, Ctrl_2 and Ctrl_3 to the high level.

When only the first control signal Ctrl_1 is enabled to the low level and the remaining control signals Ctrl_2, Ctrl_3 and Ctrl_4 are disabled to the high level, the output circuit 130 sets the first conversion data CD<0> to a specified level, that is, the low level, and outputs the second parallel input data PDATA_in<1>, the third parallel input data PDATA_in<2>, and the fourth parallel input data PDATA_in<3> as the second conversion data CD<1>, the third conversion data CD<2> and the fourth conversion data CD<3>, respectively, among the conversion data CD<0:3>. When only the second control signal Ctrl_2 is enabled to the low level and the remaining control signals Ctrl_1, Ctrl_3 and Ctrl_4 are disabled to the high level, the output circuit 130 sets the second conversion data CD<1> to a specified level, that is, the low level, and outputs the first parallel input data PDATA_in<0>, the third parallel input data PDATA_in<2>, and the fourth parallel input data PDATA_in<3> as the first conversion data CD<0>, the third conversion data CD<2>, and the fourth conversion data CD<3>, respectively, among the conversion data CD<0:3>. When only the third control signal Ctrl_3 is enabled to the low level and the remaining control signals Ctrl_1, Ctrl_2 and Ctrl_4 are disabled to the high level, the output circuit 130 sets the third conversion data CD<2> to a specified level, that is, the low level, and outputs the first parallel input data PDATA_in<0>, the second parallel input data PDATA_in<1>, and the fourth parallel input data PDATA_in<3> as the first conversion data CD<0>, the second conversion data CD<1>, and the fourth conversion data CD<3>, respectively, among the conversion data CD<0:3>. When only the fourth control signal Ctrl_4 is enabled to the low level and the remaining control signals Ctrl_1, Ctrl_2 and Ctrl_3 are disabled to the high level, the output circuit 130 sets the fourth conversion data CD<3> to a specified level, that is, the low level, and outputs the first parallel input data PDATA_in<0>, the second parallel input data PDATA_in<1>, and the third parallel input data PDATA_in<2> as the first conversion data CD<0>, the second conversion data CD<1>, and the third conversion data CD<2>, respectively, among the conversion data CD<0:3>.

In summary, in response to the pattern select signals Pat_sel<0:1> and the monitoring enable signal EM_en, the pattern conversion circuit 100 outputs the parallel input data PDATA_in<0:3> as the conversion data CD<0:3>, respectively, or sets one conversion data among the conversion data CD<0:3> to the specified level, that is, the low level, and outputs remaining parallel input data excluding parallel input data corresponding to the set conversion data as remaining conversion data.

The transmission circuit 200 outputs the conversion data CD<0:3> as the serial data SDATA in synchronization with the first to fourth clocks CLK<0:3>. For example, the transmission circuit 200 outputs the first conversion data CD<0> among the conversion data CD<0:3> as the serial data SDATA in synchronization with the first clock CLK<0>. The transmission circuit 200 outputs the second conversion data CD<1> among the conversion data CD<0: 3> as the serial data SDATA in synchronization with the second clock CLK<1>. The transmission circuit 200 outputs the third conversion data CD<2> among the conversion data CD<0:3> as the serial data SDATA in synchronization with the third clock CLK<2>. The transmission circuit 200 outputs the fourth conversion data CD<3> among the conversion data CD<0:3> as the serial data SDATA in synchronization with the fourth clock CLK<3>.

The monitoring circuit 400 monitors the serial data SDATA according to one clock selected among the first to fourth clocks CLK<0:3> in response to the first and second clock select signals SEL_clk<0:1>, and the monitoring circuit 400 outputs a monitoring result as the result signal EM_R. For example, the monitoring circuit 400 selects one among the first to fourth clocks CLK<0:3> in response to the first and second clock select signals SEL_clk<0:1>, and samples the serial data SDATA with the selected clock. The monitoring circuit 400 determines whether a data value obtained by sampling the serial data SDATA is equal to a predetermined value, and outputs a determination result as the result signal EM_R.

The monitoring circuit 400 selects one among the first to fourth clocks CLK<0:3> as a clock for sampling the serial data SDATA, and the monitoring circuit 400 generates the result signal EM_R by comparing data sampled by the selected clock with a predetermined value. At this time, if it is possible to be aware that the pattern select signals Pat_sel<0:1> set which conversion data among the conversion data CD<0:3> to the specified level and the conversion data set to the specified level is outputted as the serial data SDATA in synchronization with the clock among the first to fourth clocks CLK<0:3>, it is possible to sample, in the monitoring circuit 400, the serial data SDATA with the same clock as the clock which synchronizes the conversion data set to the specified level. Since it is determined at a design stage which data of the conversion data CD<0:3> is outputted by being synchronized with which clock of the first to fourth clocks CLK<0:3>, in the case where information (the pattern select signals Pat_sel<0:1>) on which data among the conversion data CD<0:3> is to be set to the specified level, that is, the low level, is the same as information (the clock select signals SEL_clk<0:1>) for selecting a clock to sample the serial data SDATA among the first to fourth clocks CLK<0:3>, the sample signal Sam_s will always be a low level if the transmission circuit 200 and the reception circuit 300 operate normally. Since the result signal EM_R is disabled when the sample signal Sam_s is the low level and is enabled when the sample signal Sam_s is a high level, by observing the result signal EM_R, it is possible to monitor whether data is being normally transmitted from the transmission circuit 200 to the reception circuit 300.

While various embodiments have been described above, it will be understood to those skilled in the art that the embodiments described are examples only. Accordingly, the semiconductor apparatus described herein should not be limited based on the described embodiments.

Figure 4:
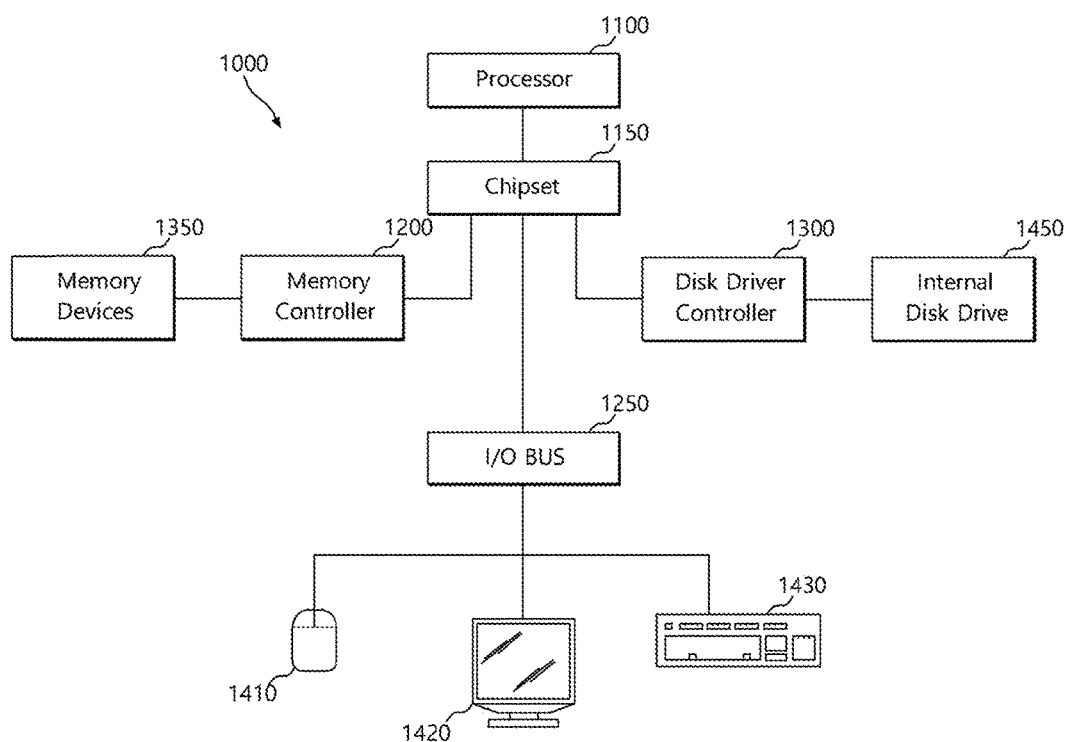
FIG. 4 illustrates a block diagram of an example system employing a semiconductor device in accordance with the various embodiments discussed above with relation to FIGS. 1-3.

The semiconductor devices discussed above (see FIGS. 1-3) are particular useful in the design of memory devices, processors, and computer systems. For example, referring to FIG. 4, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a system 1000 employing a semiconductor device as discussed above with relation to FIGS. 1-3. In alternate embodiments, such as, for example but not limited to, cellular phones or digital cameras, the components may differ from the embodiments illustrated in FIG. 4.

What is claimed is:

1. A semiconductor apparatus comprising:
    a pattern conversion circuit configured to generate conversion data in response to a monitoring enable signal, pattern select signals and parallel input data;
    a transmission circuit configured to output the conversion data as serial data in response to a plurality of clocks;
    a reception circuit configured to output the serial data as parallel output data in synchronization with the plurality of clocks; and
    a monitoring circuit configured to generate a result signal in response to the plurality of clocks, clock select signals and the serial data.

2. The semiconductor apparatus according to claim 1, wherein the pattern conversion circuit outputs the parallel input data as the conversion data in response to the monitoring enable signal regardless of state the pattern select signals, or sets a portion of the conversion data to a specified level according to the pattern select signals.

3. The semiconductor apparatus according to claim 2, wherein the pattern conversion circuit comprises:
    a decoding circuit configured to decode the pattern select signals and generate a plurality of decoding signals;
    a control circuit configured to, in response to the monitoring enable signal, generate a plurality of control signals according to the plurality of decoding signals or disable all the plurality of control signals regardless of the state of decoding signals; and
    an output circuit configured to output the parallel input data as the conversion data in response to the plurality of control signals.

4. The semiconductor apparatus according to claim 3, wherein, by decoding the pattern select signals, the decoding circuit enables a portion of the plurality of decoding signals and disables remaining decoding signals.

5. The semiconductor apparatus according to claim 3, wherein the control circuit generates the plurality of control signals in response to the plurality of decoding signals when the monitoring enable signal is enabled, and disables all the plurality of control signals regardless of the state of the plurality of decoding signals when the monitoring enable signal is disabled.

6. The semiconductor apparatus according to claim 3,
    wherein the output circuit outputs the parallel input data as the conversion data when all the plurality of control signals are disabled, and
    wherein, when a portion of the plurality of decoding signals is enabled and remaining decoding signals are disabled, the output circuit sets conversion data to be outputted in response to enabled control signal, to the specified level, and outputs conversion data to be outputted in response to disabled control signals, in response to the parallel input data.

7. The semiconductor apparatus according to claim 2, wherein the monitoring circuit selects one clock among the plurality of clocks in response to the clock select signals, samples the serial data by using the selected clock, determines whether the sampled data is equal to a predetermined data value, and generates the result signal.

8. The semiconductor apparatus according to claim 7, wherein the monitoring circuit comprises:
    a clock selection circuit configured to output one clock among the plurality of clocks as a selected clock in response to the clock select signals;
    a sampling circuit configured to sample the serial data by using the selected clock, and generate the sampled data; and a comparison circuit configured to determine whether the sampled data is equal to a predetermined data value, and generate the result signal.

9. The semiconductor apparatus according to claim 8, wherein the clock select signals are the same signals as the pattern select signals.

10. The semiconductor apparatus according to claim 1, wherein the conversion data comprises first to fourth conversion data and the transmission circuit outputs the first to fourth conversion data as the serial data in synchronization with first to fourth clocks.

11. A semiconductor apparatus comprising:
a pattern conversion circuit configured to output a plurality of parallel input data as a plurality of conversion data in response to pattern select signals when a monitoring enable signal is enabled, and set one among the plurality of conversion data to a specified level;
a transmission circuit configured to output the plurality of respective conversion data as serial data in synchronization with a plurality of clocks, respectively;
a reception circuit configured to output the serial data as a plurality of parallel output data in synchronization with the plurality of clocks, respectively; and
a monitoring circuit configured to sample the serial data by using one clock among the plurality of clocks in response to clock select signals, compare a sampled data value with a predetermined data value, and generate a result signal.

12. The semiconductor apparatus according to claim 11, wherein the plurality of parallel input data comprise first to fourth parallel input data,
wherein the plurality of conversion data comprise first to fourth conversion data,
wherein the plurality of clocks comprise first to fourth clocks,
wherein the plurality of parallel output data comprise first to fourth parallel output data, and
wherein the transmission circuit outputs the first conversion data as the serial data in synchronization with the first clock, outputs the second conversion data as the serial data in synchronization with the second clock, outputs the third conversion data as the serial data in synchronization with the third clock, and outputs the fourth conversion data as the serial data in synchronization with the fourth clock.

13. The semiconductor apparatus according to claim 12, wherein the reception circuit outputs the serial data as the first parallel output data in synchronization with the first clock, outputs the serial data as the second parallel output data in synchronization with the second clock, outputs the serial data as the third parallel output data in synchronization with the third clock, and outputs the serial data as the fourth parallel output data in synchronization with the fourth clock.

14. The semiconductor apparatus according to claim 13, wherein the pattern conversion circuit sets one of the first to fourth conversion data to the specified level in response to the pattern select signals when the monitoring enable signal is enabled.

15. The semiconductor apparatus according to claim 14, wherein the pattern conversion circuit comprises:
a decoding circuit configured to decode the pattern select signals and enable one among first to fourth decoding signals;
a control circuit configured to enable one among first to fourth control signals in response to the first to fourth decoding signals when the monitoring enable signal is enabled, and disable all the first to fourth control signals when the monitoring enable signal is disabled; and
an output circuit configured to output the first parallel input data as the first conversion data in response to the first control signal, output the second parallel input data as the second conversion data in response to the second control signal, output the third parallel input data as the third conversion data in response to the third control signal, and output the fourth parallel input data as the fourth conversion data in response to the fourth control signal.

16. The semiconductor apparatus according to claim 15, wherein the output circuit outputs the first to fourth parallel input data as the first to fourth conversion data, respectively, when the first to fourth control signals are disabled, or set conversion data corresponding to a control signal enabled among the first to fourth control signals, to the specified level.

17. The semiconductor apparatus according to claim 12, wherein the clock select signals are inputted to the monitoring circuit according to information on which conversion data among the first to fourth conversion data is set to the specified level.

18. The semiconductor apparatus according to claim 17, wherein the information on which conversion data among the first to fourth conversion data is set to the specified level corresponds to the pattern select signals.

19. The semiconductor apparatus according to claim 18, wherein the clock select signals are generated according to the pattern select signals.

20. The semiconductor apparatus according to claim 17, wherein the monitoring circuit comprises:
a clock selection circuit configured to output one among the first to fourth clocks as a selected clock in response to the clock select signals;
a sampling circuit configured to sample the serial data by using the selected clock, and generate a sampling signal; and
a comparison circuit configured to compare the sampled signal and a predetermined value, to generate the result signal.

* * * * *